United States Patent
Imahashi et al.

(10) Patent No.: US 6,431,114 B1
(45) Date of Patent: Aug. 13, 2002

(54) METHOD AND APPARATUS FOR PLASMA PROCESSING

(75) Inventors: Issei Imahashi, Yamanashi-Ken; Nobuo Ishii, Minoo; Satoru Kawakami, Sagamihara; Yoshinobu Kawai; Yoko Ueda, both of Fukuoka, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/659,340

(22) Filed: Sep. 12, 2000

Related U.S. Application Data

(63) Continuation of application No. PCT/JP99/05312, filed on Sep. 29, 1999.

(30) Foreign Application Priority Data

Sep. 30, 1998 (JP) ............................................ 10-293048

(51) Int. Cl.$^7$ ............................ C23C 16/00; H05H 1/00
(52) U.S. Cl. ................. 118/723 MW; 118/723 MA; 118/723 ME; 118/723 MR; 156/345.41; 156/345.42; 156/345.36
(58) Field of Search ....................... 118/723 MW, 118/723 MA, 723 ME, 723 MR, 724; 156/345.41, 345.42, 345.36

(56) References Cited

U.S. PATENT DOCUMENTS

| | | | | |
|---|---|---|---|---|
| 4,971,651 A | * | 11/1990 | Watanabe et al. | ............. 216/70 |
| 5,529,632 A | * | 6/1996 | Katayama et al. | .... 118/723 MP |
| 6,087,614 A | * | 7/2000 | Ishizuka et al. | ....... 219/121.43 |
| 6,136,387 A | * | 10/2000 | Koizumi | ..................... 427/562 |

FOREIGN PATENT DOCUMENTS

| | | |
|---|---|---|
| JP | 3-224225 | 10/1991 |
| JP | 3-263321 | 11/1991 |
| JP | 6-112161 | 4/1994 |
| JP | 9-148097 | 6/1997 |
| JP | 9-148308 | 6/1997 |
| JP | 10-233389 | 9/1998 |

* cited by examiner

Primary Examiner—Gregory Mills
Assistant Examiner—P. Hassanzadeh
(74) Attorney, Agent, or Firm—Finnegan, Henderson, Farabow, Garrett & Dunner LLP

(57) ABSTRACT

The present invention aims to decrease reflected waves in a vacuum chamber to suppress standing waves, thereby easily controlling a plasma density so that uniform treatment can be performed. An electromagnetic wave absorber 6 composed of a resistor such as carbon, a dielectric having a large dielectric loss, such as water, or a magnetic material such as ferrite-based ceramic, or a combination of these, is provided on an inner wall surface of a first vacuum chamber 21. Microwaves introduced from a waveguide 25 into the first vacuum chamber 21 via a transmissive window 23 are absorbed to the electromagnetic wave absorber 6 to suppress reflected waves, whereby a plasma density distribution with a nearly planned pattern is easily formed at an ECR point.

6 Claims, 5 Drawing Sheets

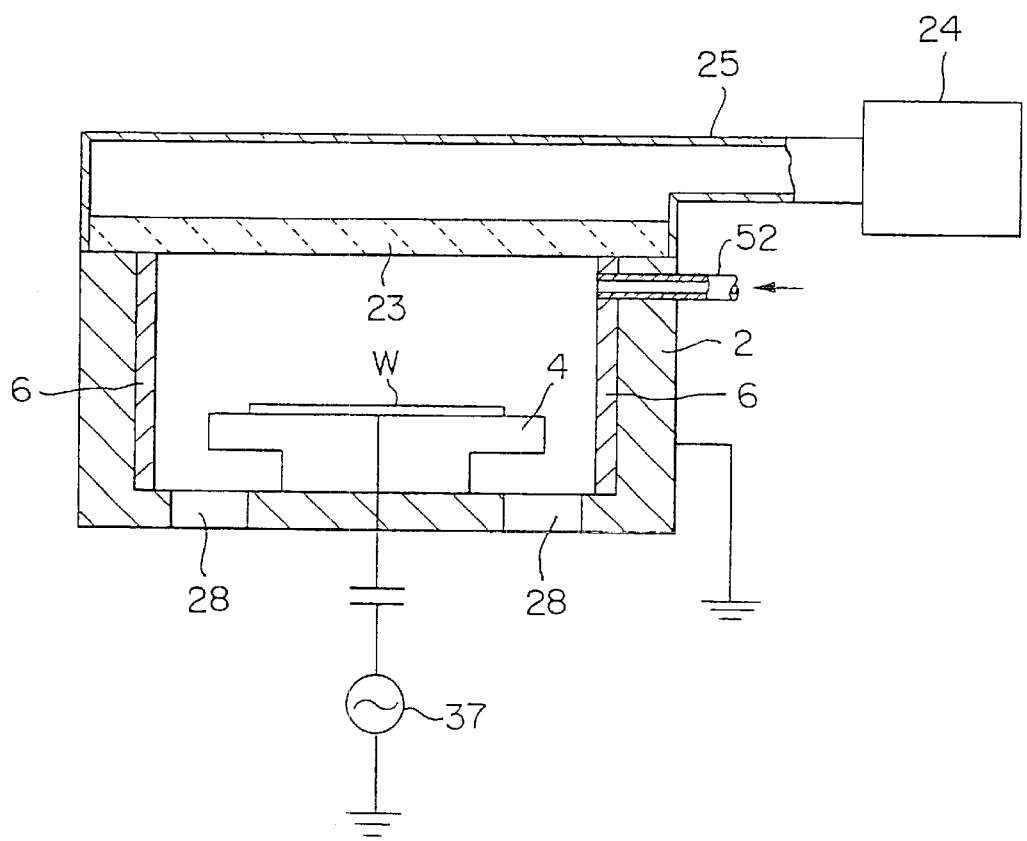
F I G. 4

METHOD AND APPARATUS FOR PLASMA PROCESSING

CROSS REFERENCE TO RELATED APPLICATION

This application is a continuation of International Application No. PCT/JP99/05312, filed Sep. 29, 1999.

BACKGROUND OF THE INVENTION

Recently, an ECR (electron cyclotron resonance) plasma processing method, which causes a microwave discharge by use of resonance between a cyclotron motion of electrons and a microwave in a magnetic field, has attracted attention as one of the plasma-based film forming and etching methods. According to this method, a high density plasma can be generated in a high vacuum by an electrodeless discharge. Thus, this method is advantageous in that high speed surface treatment can be performed, and in that contamination of a semiconductor wafer (hereinafter referred to as "wafer") or the like is unlikely.

TECHNICAL FIELD

This invention relates to a plasma processing apparatus and a plasma processing method, more specifically, to a plasma processing apparatus and a plasma processing method in which electron cyclotron resonance is utilized.

An example of a conventional plasma processing apparatus for performing the ECR plasma treatment will be described with reference to FIG. 5A which illustrates film formation. In this plasma processing apparatus, microwaves of, for example, 2.45 GHz supplied through a waveguide 13 are introduced into a plasma generation chamber 1A of a vacuum vessel 1 via a microwave transmitting window 14. Simultaneously, a magnetic field of a predetermined magnitude, e.g., 875 gausses, is applied by an electromagnetic coil 10 so that a plasma-generating gas, such as an Ar gas or an $O_2$ gas, is converted into a high density plasma by the interaction between the microwaves and the magnetic field (i.e., electromagnetic cyclotron resonance). The resulting plasma activates a reactive processing gas, e.g., $SiH_4$ gas, introduced sideways into a film forming chamber 1B of the vacuum vessel 1 to form active species. The active species carry out both of sputter etching of and deposition on the surface of a silicon wafer W laid on a bearing stand 11 connected to a high frequency power source unit 12. The contradictory sputter etching operation and deposition operation are controlled such that the deposition operation is predominant from a macroscopic viewpoint. As a whole, deposition takes place.

Generally, the execution of uniform treatment requires a uniform plasma distribution on the wafer surface. For this purpose, a plasma density distribution D1 having mountain-shaped ends needs to be obtained near the ECR point above the wafer. The inventor of the present invention is aware of this fact. Formation of such a plasma density distribution results in a group of magnetic lines of force spreading toward the wafer. The degree of their spread is greater at the peripheral edge than at the center of the wafer. Thus, the plasma density distribution becomes flat on the wafer.

However, the inner water surface of the conventional plasma generation chamber 1A is made of a metal. Thus, the microwaves introduced into the plasma generation chamber 1A are reflected by its inner wall surface, whereupon standing waves as shown by arrows in FIG. 5A appear. As a result, the electric field strength distribution in the plasma generation chamber 1A is overlaps of the strength distribution of the microwaves introduced from the outside, and the strength distribution in cavity modes by the plasma generation chamber 1A that plays the role of a cavity. This poses the problem that, as shown in FIG. 5B, the plasma density D1 at the mountain-shaped ends becomes nonuniform relative to the circumferential direction, making uniform film formation impossible.

SUMMARY OF THE INVENTION

The present invention has been accomplished to solve the above problem, and the object of the present invention is to provide a plasma processing apparatus and a plasma processing method, each of which enables reduction of reflected waves in a vacuum chamber to suppress standing waves, thereby easily controlling the plasma density so that uniform treatment can be performed.

To attain this object, the present invention provides with a plasma processing apparatus of a type that microwaves are introduced from a waveguide into a vacuum chamber via a transmissive window, a processing gas is converted into a plasma by means of the microwaves, and that a object to be processed is processed with the plasma. The apparatus is characterized in that an electromagnetic wave absorber is provided on an inner wall surface of the vacuum chamber.

Preferably, the electromagnetic wave absorber is composed of a resistor, a dielectric having a large dielectric loss, or a magnetic material having a large magnetic loss, or a combination of these.

According to another aspect of the present invention, there is provided a plasma processing method including the steps of: introducing microwaves from a waveguide into a vacuum chamber via a transmissive window; absorbing the microwaves to an electromagnetic wave absorber in the vacuum chamber to suppress reflected waves, thereby generating a plasma in an area opposed to a object to be processed, the area being located between the transmitting window and the object, the plasma having a nonuniform plasma density distribution with a plasma density higher at a peripheral area of the plasma than at a central area of the plasma; and treating the object with the plasma.

According to the present invention, the microwaves introduced into the vacuum chamber via the transmitting window are absorbed to the electromagnetic wave absorber. Thus, reflected waves in the vacuum chamber are suppressed, and control of a plasma density distribution is facilitated. Hence, uniform treatment can be performed.

BRIEF DESCRIPTION OF THE DRAWINGS

FIG. 4 is a vertical sectional view of an embodiment of the plasma processing apparatus according to another aspect of the invention.

DESCRIPTION OF THE PREFERRED EMBODIMENTS

Figure 1:
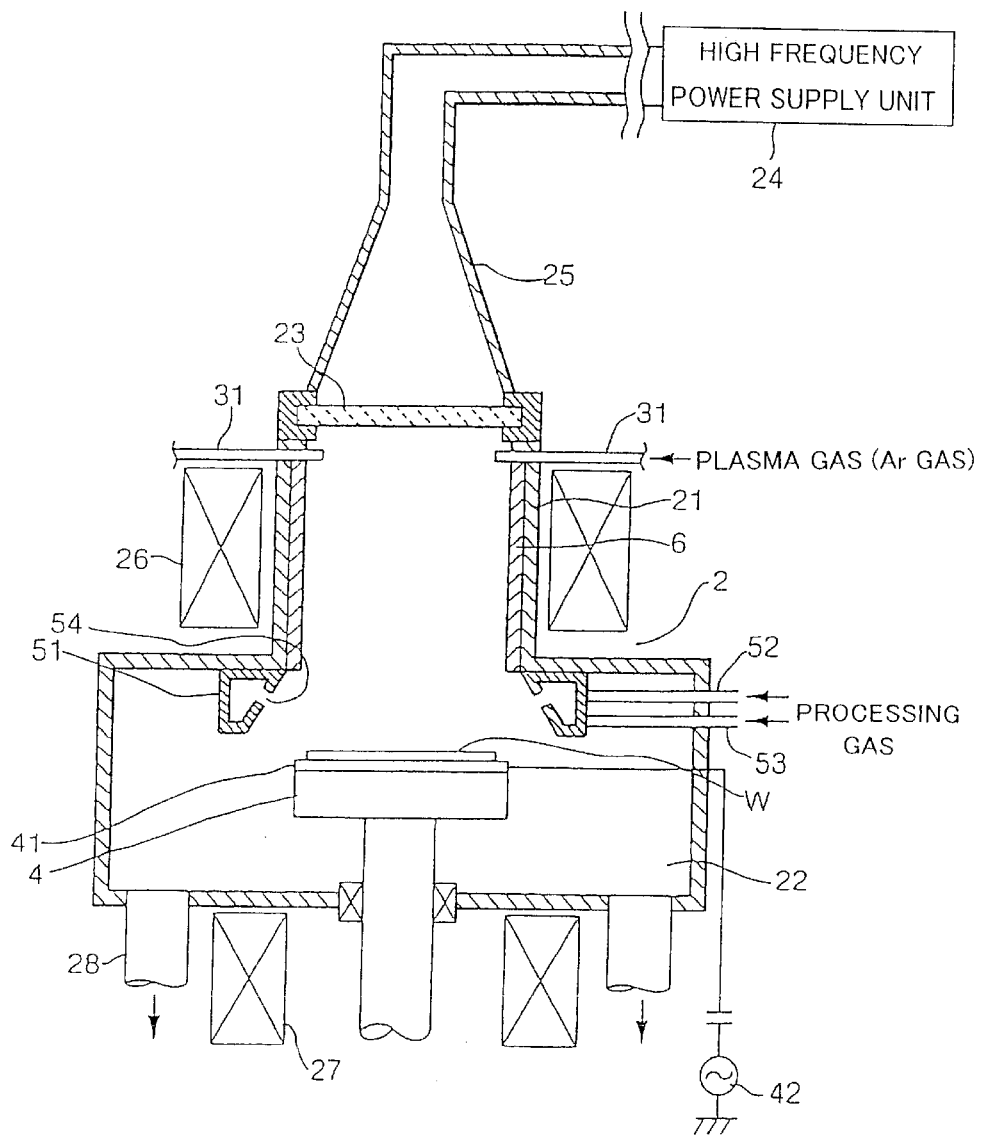
FIG. 1 is a vertical sectional view of an embodiment of an ECR plasma processing apparatus according to the present invention.

FIG. 1 is a vertical sectional view of an embodiment of the plasma processing apparatus according to the present invention. This apparatus has a vacuum vessel 2 formed, for example, of aluminum. The vacuum vessel 2 has a tubular first vacuum chamber 21 for generating a plasma located upper part of the vessel 2, and a tubular second vacuum chamber 22 located below the first vacuum chamber 21, connected thereto and communicating therewith. The second vacuum chamber 22 has a larger bore than that of the first vacuum chamber 21. The vacuum vessel 2 is grounded to have zero electric potential.

An upper end of the vacuum vessel 2 is open. A member transmissive to microwaves, for example, a transmissive window 23 formed of quartz, is fixed to the upper open end of the vessel 2 in an airtight fashion to maintain a vacuum state inside the vacuum vessel 2.

Provided outside of the transmitting window 23 is a waveguide 25, which is connected to a high frequency power source unit 24 for generating microwaves of, for example, 2.45 GHz. Microwaves generated by the high frequency power source unit 24 may be introduced, for example, in a TE mode into the first vacuum chamber 21 via the waveguide 25. Alternatively, the microwaves guided in a TE mode may be converted to a TM mode in the waveguide 25, and introduced into the first vacuum chamber 21 via the microwave transmissive window 23.

Provided in a side wall defining the first vacuum chamber 21 are gas nozzles 31, which are equally arranged in its circumferential direction. A gas source (not shown), e.g., an Ar gas source, is connected to the nozzles 31, which supplies an Ar gas evenly and equally to an upper portion of the first vacuum chamber 21.

Provided on an inner wall surface of the side wall defining the first vacuum chamber 21 is an electromagnetic wave absorber 6, which absorbs the microwaves introduced into the first vacuum chamber 21 via the transmitting window 23. The electromagnetic wave absorber 6 suppresses the reflection of the microwaves in order to inhibit generation of standing waves. The electromagnetic wave absorber 6 may also be provided in the second vacuum chamber 22 for the purpose of absorbing an electromagnetic field leaking from the first vacuum chamber 21.

Provided in the second vacuum chamber 22 is a table 4, on which a wafer W, as an object to be processed, is placed. The table 4 is opposed to the first vacuum chamber 21. The table 4 has an electrostatic chuck 41 provided at the surface thereof. Connected to an electrode of the electrostatic chuck 41 is a direct current power source (not shown) that applies a voltage thereto, for attracting the wafer W. A high frequency power source 42 that applies a bias voltage for taking ions into the wafer W is also connected to the electrode of the electrostatic chuck 41.

A ring-shaped processing gas supply section 51 is provided in an upper portion of the second vacuum chamber 22, i.e., a portion communicating with the first vacuum chamber 21.

The processing gas supply section 51 is supplied with, for example, two kinds of processing gases via gas supply pipes 52, 53. The processing gases are mixed in the processing gas supply section 51, and fed into the second vacuum chamber 22 through a gas hole 54 provided in an inner peripheral surface of the processing gas supply section 51.

A ring-like main electromagnetic coil 26, i.e., magnetic field forming means, is disposed near an outer periphery of the side wall defining the first vacuum chamber 21. Below the second vacuum chamber 22, a ring-like auxiliary electromagnetic coil 27 is disposed. To the bottom of the second vacuum chamber 22, exhaust pipes 28 are connected at two positions symmetrical with respect to a central axis of the vacuum chamber 22.

Figure 2:
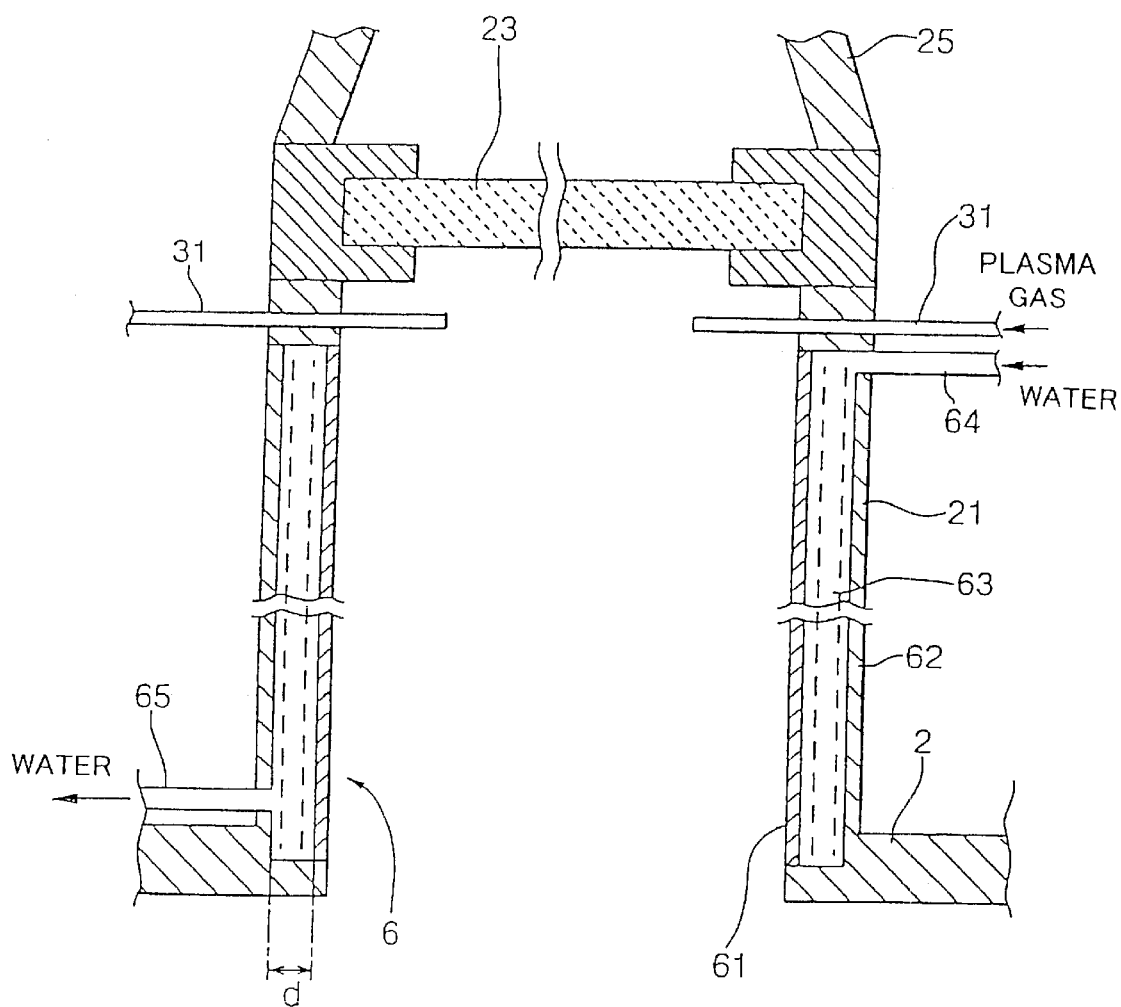
FIG. 2 is an vertical sectional view of an essential portion in the plasma processing apparatus of FIG. 1, showing an example of an electromagnetic wave absorber.

Next, the configuration of the electromagnetic wave absorber 6 will be described in detail with reference to FIG. 2. FIG. 2 shows an example in which the electromagnetic wave absorber 6 is composed of a combination of water and glass.

As shown in FIG. 2, in the side wall of the first vacuum chamber 21, at least a portion in which reflection of the microwaves can occur, namely, a portion over the entire periphery ranging from a site just below the gas nozzles 31 to a site near the lower end of the first vacuum chamber 21, has a tubular jacketed structure. That is, a jacket 63 through which water flows is formed between a glass bulkhead plate 61 facing the interior of the first vacuum chamber 21, and an aluminum outer wall 62 facing the outside of the first vacuum chamber 21. At an upper position of the jacket 63, a water feed pipe 64 is connected. At a lower position of the jacket 63, a water discharge pipe 65 is connected.

The reason for the use of water as a main constituent element of the electromagnetic wave absorber 6 is as follows. Generally, when absorption of electromagnetic waves is required, value of tan δ as an indicator of the degree of absorption of an electromagnetic wave, is preferably 0.01 or more, and more preferably about 0.1. Water has a value of tanδ, at 25° C. as high as 0.16. Thus, water is suitable for the electromagnetic wave absorber.

The width of the channel of the jacket portion 63, i.e., the distance d between the glass bulkhead plate 61 and the outer wall 62, is, although not restricted to, 13 mm, for example. In this case, therefore, a water jacket of 13 mm thick is formed in the side wall of the first vacuum chamber 21. The reason for setting the thickness at 13 mm is that electromagnetic waves of 2.45 GHz, i.e., the microwaves used in this example, are absorbed, whereby an electric field resulting from the electromagnetic waves is nearly halved. The length of one wavelength of a microwave of 2.45 GHz in a vacuum is about 12 cm. The thickness of the glass bulkhead plate 61 is, for example, about 5 to 10 mm.

Next will follow an explanation for a method for forming an interlayer insulator comprising, for example, a CF film on the wafer W by the above-described apparatus. Valves (not shown) provided in the water feed pipe 64 and the water discharge pipe 65 are opened to flow water in the jacket 63. Then, a gate valve (not shown) provided in the side wall of the vacuum vessel 2 is opened, and then a wafer W having an aluminum wiring formed on its surface is carried from a load locking chamber (not shown) into the vacuum vessel 2 by a carrier arm (not shown). The wafer W is placed on the table 4 by the carriage arm, and is electrostatically attracted by the electrostatic chuck 41.

Then, the gate valve is closed to seal up the interior of the vacuum vessel 2. Then, the inside atmosphere is evacuated through the exhaust pipes 28 to a predetermined degree of vacuum. A plasma generating gas, e.g., an Ar gas, is introduced into the first vacuum chamber 21 through the plasma gas nozzles 31, while a CF-based film forming gas is introduced at a predetermined flow rate into the second vacuum chamber 22 from the film forming gas supply section 51.

The interior of the vacuum vessel 2 is maintained at a predetermined process pressure. Simultaneously, a bias voltage of 13.56 MHz and 1500 W is applied to the table 4 by the high frequency power source 42, and the surface temperature of the table 4 is set at about 400° C.

High frequency waves (microwaves) of 2.45 GHz from the high frequency power source unit 24 pass through the waveguide 25, reach the ceiling of the vacuum vessel 2, penetrate through the microwave transmissive window 23, and enter the first vacuum chamber 21. Among the introduced microwaves, the microwaves directed toward the inner wall surface of the first vacuum chamber 21 are absorbed by the electromagnetic wave absorber 6. Thus, standing waves due to reflection from the inner wall surface are suppressed, and the influence of an electric field strength distribution in cavity modes by the first vacuum chamber 21 becomes minimal. As a result, the electric field strength distribution of the microwaves introduced from the outside into the first vacuum chamber 21 is predominant.

In the vacuum vessel 2, a magnetic field directed from the upper portion of the first vacuum chamber 21 toward the lower portion of the second vacuum chamber 22 is formed by the electromagnetic coils 26, 27. At a site near the lower portion of the first vacuum chamber 21, the intensity of the magnetic field is 875 gausses. Because of the interaction between the magnetic field and the microwaves, electron cyclotron resonance occurs. By the resonance, the Ar gas is converted into a plasma, which is highly dense.

Figure 3A:
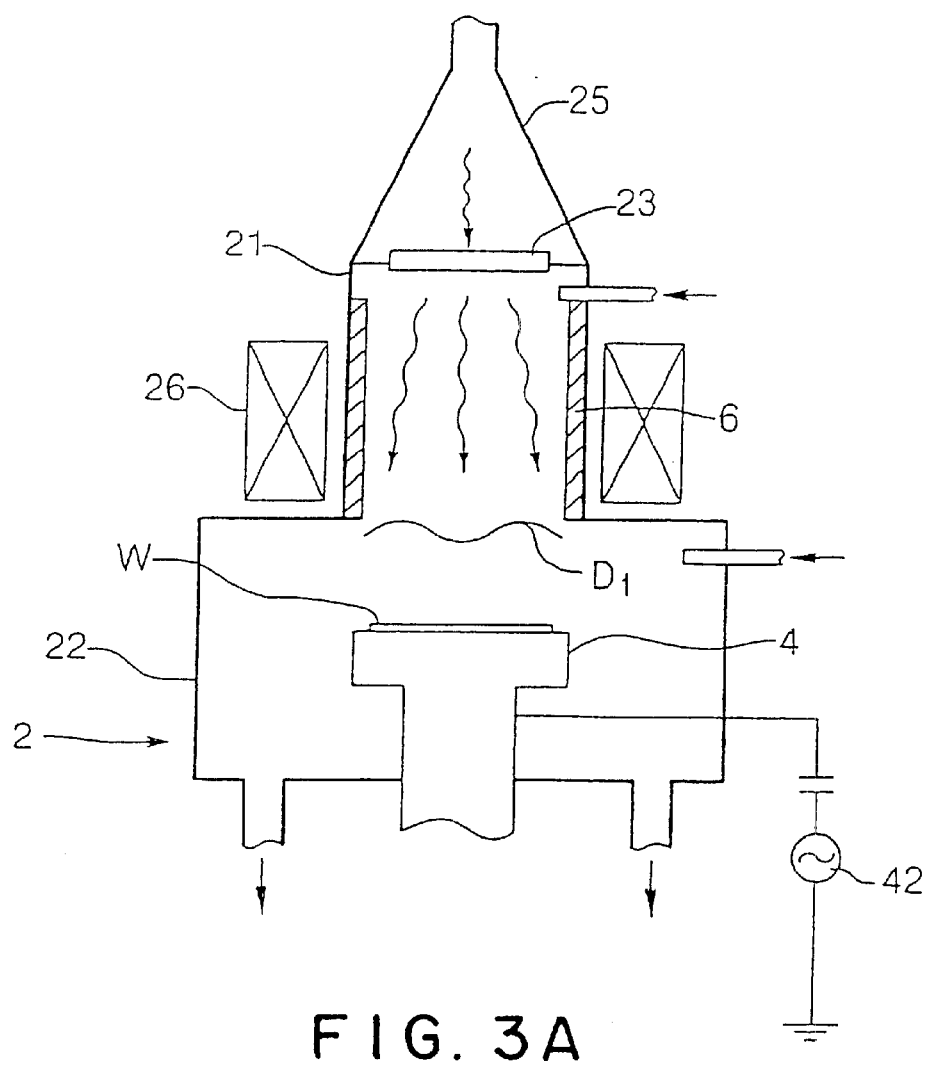
FIG. 3A is a schematic view of the plasma processing apparatus of FIG. 1.

At an ECR point, the plasma having a plasma density distribution with a desired pattern, i.e., a nonuniform plasma density distribution with a plasma density higher at a peripheral portion of the plasma than that at the central portion of the plasma, is produced. In other words, as shown in FIG. 3A, in an area opposed to the wafer W and located on the side of the transmissive window 23 the plasma is produced.

A stream of the plasma flowing from the first vacuum chamber 21 into the second vacuum chamber 22 activates the CF-based gas fed to the second vacuum chamber 22 to form active species. On the other hand, plasma ions, i.e., Ar ions in the present embodiment, are pulled into the wafer W by the bias voltage of 13.56 MHz and 1,500 W applied by the high frequency power source unit 42 to the bearing stand 4 to scrape off the corners of the pattern (depressions) on the surface of the wafer W, broadening the width. In parallel with this sputter etching action, a plasma of the film forming gas forms a CF film, which is buried in the depressions. As a result, an interlayer insulator comprising the CF film is formed on the wafer W.

Figure 3B:
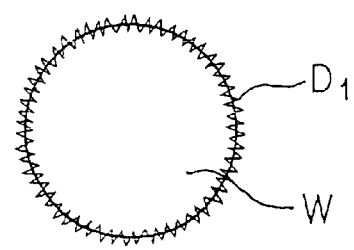
FIG. 3B is a view showing a circumferential distribution of the plasma density near the ECR point above a peripheral edge portion of a wafer.
Figure 5A:
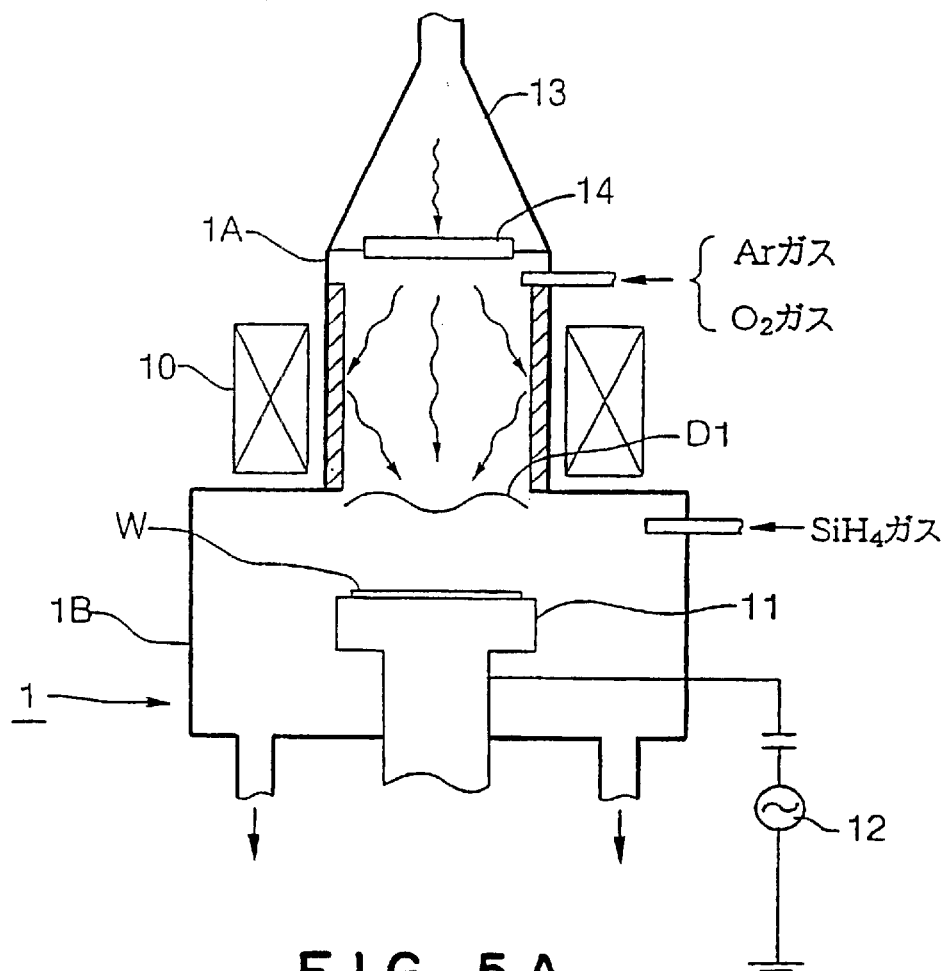
FIG. 5A is a schematic view of a conventional plasma processing apparatus.
Figure 5B:
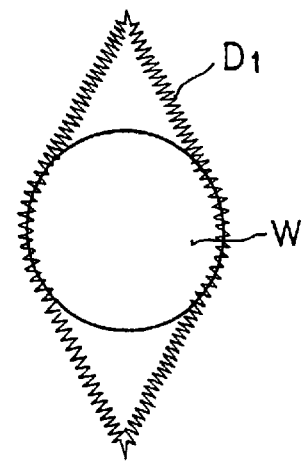
FIG. 5B is a view showing a circumferential distribution of the plasma density near the ECR point above a peripheral edge portion of a wafer.

According to the foregoing embodiment, the electromagnetic wave absorber 6 is provided on the inner wall surface of the first vacuum chamber 21. Thus, microwaves directed to the inner wall surface of the first vacuum chamber 21 among the microwaves introduced into the first vacuum chamber 21 via the transmitting window 23 are absorbed by the electromagnetic wave absorber 6. As a result, reflected waves in the first vacuum chamber 21 are suppressed. Consequently, control of the plasma density is facilitated, and a plasma, which has a planned plasma density distribution pattern, i.e., a nonuniform plasma density distribution with a plasma density higher at a peripheral edge portion of the plasma than at the center of the plasma, and a uniform circumferential distribution of the plasma density at the peripheral edge portion as shown in FIG. 3B, can be generated with high accuracy at the ECR point. Hence, uniform film formation can be performed.

Next, other embodiments will be described.

[Specifications for the Electromagnetic Wave Absorber 6]

The above embodiment shows an example in which the electromagnetic wave absorber 6 was formed from a combination of water and glass. However, the electromagnetic wave absorber 6 may be formed from a dielectric other than water, a resistor, or a magnetic material, or may be formed from a combination of these.

As the resistor, a resistor containing carbon or the like,for example, can be used. For instance, TDK's C-containing material can be used. As the magnetic material, a ferrite-containing ceramic, for example, can be used. For instance, TDK's (TDK is a Japanese company name) Fe-based ceramic can be used.

No matter which of the resistor, magnetic material and dielectric is used as the electromagnetic wave absorber 6, it is recommendable to use a substance having $\tan\delta$ of, preferably, 0.01 or more, and more preferably of the order of 0.1, in the frequency band of the microwaves used (2.45 GHz in the present embodiment).

The attenuation characteristics of microwaves when water was used as the dielectric, a Fe-based ceramic as the magnetic material, and a C-containing resistor as the resistor will be shown below. When water (25° C.) was used as the dielectric, the ratio of a reflected power to a microwave incident power is calculated at ⅓ for a water layer thickness (width of the jacket 63) of 1 cm, and 1/10 for this thickness of 2 cm. When an Fe-based ceramic is used as the magnetic material, the ratio of the reflected power to the microwave incident power is calculated at 1/10 for a magnetic material thickness (thickness of the electromagnetic wave absorber 6) of 0.5 cm, and 1/100 for this thickness of 1 cm. When a C-containing resistor is used as the resistor, the ratio of the reflected power to the microwave incident power is calculated at ½ for a resistor thickness (thickness of the electromagnetic wave absorber 6) of 10 cm, and 1/10 for this thickness of 15 cm.

The effect of removing the influence of reflected waves can be confirmed, starting at the reflected power/microwave incident power ratio of about 9/10. To obtain a higher effect, the electromagnetic wave absorber 6 should be designed so that the reflected power/microwave incident power ratio will be ½ or less, more preferably 1/10 or less.

[Range for Provision of the Electromagnetic Wave Absorber]

In the above-mentioned embodiment, the electromagnetic wave absorber 6 is provided in the range from a site immediately below the gas nozzles 31 to a site near the lower end of the first vacuum chamber 21. However, the provision of the absorber 6 is not restricted to this range. That is, reflected waves at a site nearer to the second vacuum chamber 22 than to the point of maximum plasma density, i.e., the ECR point, do not exert considerable adverse influence on the controllability of the plasma density. Thus, the electromagnetic wave absorber 6 may be provided at least in an area above the ECR point, but below the gas nozzles 31 (the area from the point at which the plasma gas begins to be converted into a plasma to the point at which the plasma density of the plasma gas becomes maximal, namely, the plasma generation area).

Even when the plasma processing apparatus is not an ECR plasma processing apparatus, the range of provision of the electromagnetic wave absorber 6 may be determined based on the same concept. That is, the electromagnetic wave absorber 6 may be provided in an area in a range from the point at which the plasma gas begins to be converted into a plasma, i.e., normally a site closest to the gas nozzles for the plasma gas, to a site where the plasma density of the plasma gas becomes maximal.

[Constitution of the Apparatus, etc.]

Embodiments of the present invention are not restricted to those shown in FIGS. 1 to 3(A) and 3(B). That is, the apparatus may be constituted so that the exhaust pipes are connected to a side portion of the bottom of the vacuum chamber, or an electromagnetic coil for formation of a magnetic field may be provided laterally of the waveguide. Alternatively, the object to be processed is not limited to a wafer, but may be a glass substrate for a liquid crystal display.

Moreover, the present invention can be applied not only to an apparatus for film formation, but also to various apparatuses that perform plasma processing, for example, an etcher for etching an object by use of a plasma converted from a CF-based gas. Furthermore, the plasma processing apparatus is not restricted to an ECR plasma processing apparatus, but is applicable to a plasma processing apparatus as shown, for example, in FIG. 4. The plasma processing apparatus shown in FIG. 4 is a microwave plasma apparatus that does not use magnetic field generating means. In FIG. 4, members corresponding to the constituent elements of the ECR plasma processing apparatus shown in FIG. 1 are assigned the same numerals. As shown in FIG. 4, an electromagnetic wave absorber 6 is provided on an inner wall of a vacuum chamber 2.

What is claimed is:

1. A plasma processing apparatus comprising:
    a high frequency power supply unit that generates microwaves;
    a vacuum vessel having a microwave-transmissive member;
    a waveguide that guides the microwave, which is generated by the high frequency power supply unit, to an interior of the vacuum vessel via the transmissive member;
    a plasma gas supplying port that introduces a plasma gas into the vacuum vessel;
    a processing gas supplying port that introduces a processing gas into the vacuum vessel; and
    an electromagnetic wave absorber provided in a range on an inner wall surface of the vacuum vessel, the range corresponding to a region from a point at which the plasma gas begins to be converted into a plasma to a point at which a plasma density of the plasma becomes maximal.

2. The plasma processing apparatus according to claim 1, wherein the plasma processing apparatus is of a type that the plasma gas is converted into the plasma by an interaction between the microwaves and a magnetic field.

3. The plasma processing apparatus according to claim 1, wherein the electromagnetic wave absorber is composed of any one of, or a combination of, a resistor, a dielectric having a large dielectric loss, and a magnetic material having a large magnetic loss.

4. The plasma processing apparatus according claim 1, wherein said apparatus is an ECR plasma processing apparatus, and the point at which a plasma density of the plasma becomes maximal is an ECR point.

5. A plasma processing method comprising the steps of:
    introducing microwaves from a waveguide into a vacuum vessel via a transmissive window;
    introducing a plasma gas into the vacuum vessel;
    introducing a processing gas into the vacuum vessel;
    absorbing the microwaves directed to an inner wall of the vacuum vessel by an electromagnetic wave absorber provided on the inner wall to suppress reflected waves, thereby converting the plasma gas in the vacuum vessel in order to generate a plasma in an area opposed to an object to be processed , the area being located between the transmitting window and the object, the plasma having a non-uniform plasma density distribution with a plasma density higher at a peripheral area of the plasma than that at a central area of the plasma;
    activating the processing gas by the plasma having the non-uniform plasma density distribution, thereby generating an active species; and
    treating the object with the active species.

6. A plasma processing method according to claim 5, wherein the step of converting the plasma gas is carried out under a condition that an electron cyclotron resonance occurs by an interaction between the microwaves and a magnetic field, and
    wherein the plasma having the non-uniform plasma density distribution is generated at an ECR point.

* * * * *